(12) United States Patent
Kubo et al.

(10) Patent No.: US 6,589,827 B2
(45) Date of Patent: Jul. 8, 2003

(54) SEMICONDUCTOR DEVICE AND METHOD FOR FABRICATING THE SAME

(75) Inventors: Hiroko Kubo, Uji (JP); Kenji Yoneda, Kyoto (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/911,618

(22) Filed: Jul. 25, 2001

(65) Prior Publication Data

US 2002/0019101 A1 Feb. 14, 2002

(30) Foreign Application Priority Data

Jul. 27, 2000 (JP) .......................... 2000-226559

(51) Int. Cl.⁷ .................. H01L 21/84; H01L 21/338; H01L 21/337; H01L 21/8238; H01L 21/425
(52) U.S. Cl. ................ 438/157; 438/149; 438/151; 438/176; 438/195; 438/201; 438/514; 438/517; 438/724
(58) Field of Search ............... 438/149, 151, 438/157, 176, 195, 201, 724, 514, 517

(56) References Cited

U.S. PATENT DOCUMENTS

| | | | | |
|---|---|---|---|---|
| 5,180,690 A | * | 1/1993 | Czubatyj et al. ............ 136/258 |
| 5,254,488 A | * | 10/1993 | Haller ........................ 430/315 |
| 5,356,821 A | * | 10/1994 | Naruse et al. ......... 148/DIG. 9 |
| 5,557,121 A | * | 9/1996 | Kozuka et al. ............. 257/186 |
| 5,759,898 A | * | 6/1998 | Ek et al. ..................... 117/939 |
| 5,760,420 A | * | 6/1998 | Song ........................... 257/57 |
| 5,847,419 A | * | 12/1998 | Imai et al. .................. 257/190 |
| 5,981,345 A | | 11/1999 | Ryum et al. |
| 6,190,937 B1 | * | 2/2001 | Nakagawa et al. ......... 438/458 |
| 6,246,070 B1 | * | 6/2001 | Yamazaki et al. .......... 257/347 |
| 6,346,732 B1 | * | 2/2002 | Mizushima et al. ........ 257/382 |
| 6,369,438 B1 | * | 4/2002 | Sugiyama et al. .......... 257/192 |
| 6,372,593 B1 | * | 4/2002 | Hattori et al. .............. 438/311 |

* cited by examiner

Primary Examiner—David Nelms
Assistant Examiner—Ly Duy Pham
(74) Attorney, Agent, or Firm—Nixon Peabody LLP; Donald R. Studebaker

(57) ABSTRACT

A silicon germanium layer is deposited over a semiconductor substrate with a gate insulating film interposed between the substrate and the silicon germanium layer. Then, an upper silicon layer in an amorphous state is deposited on the silicon germanium layer. Thereafter, a gate electrode is formed by patterning the silicon germanium layer and the upper silicon layer.

14 Claims, 10 Drawing Sheets

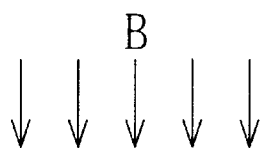

SEMICONDUCTOR DEVICE AND METHOD FOR FABRICATING THE SAME

BACKGROUND OF THE INVENTION

The present invention relates to a semiconductor device including a gate electrode and a method for fabricating the device.

Recently, as semiconductor devices have been downsized drastically and as the number of devices integrated on a chip has been increasing steeply, dual-gate CMOSFETs (complementary metal-oxide semiconductor field-effect transistors) have been used more and more widely.

Hereinafter, a p-channel MOSFET included in a known dual-gate CMOS device will be described as a typical known semiconductor device with reference to FIG. 11.

As shown in FIG. 11, a gate electrode 3 of polysilicon is formed over a semiconductor substrate 1 of silicon with a gate insulating film 2 interposed between them. Normally, the gate electrode 3 is doped with a dopant, e.g., boron (B), by an ion implantation technique. The boron ions are implanted into a polysilicon film, of which the gate electrode 3 will be made, at an energy low enough to form a boron concentration profile in the gate electrode 3 with one of its peaks located near the upper surface thereof and to prevent the boron atoms from penetrating through the gate insulating film 2 into the semiconductor substrate 1.

In this case, if the polysilicon film to be the gate electrode 3 is annealed after having been doped with boron, the boron atoms in the polysilicon film diffuse toward the semiconductor substrate 1. Any inappropriate condition for the annealing process causes the boron atoms in the polysilicon film to permeate through the gate insulating film 2 in the semiconductor substrate 1. Then, the dopant concentration in the semiconductor substrate 1 changes to degrade the device characteristics. Also, where a metal layer is deposited on the polysilicon film to form a poly-metal gate electrode and then a silicon nitride film to be a hard mask is deposited on the metal layer and annealed or where a silicon nitride film to be a sidewall is deposited on the gate electrode 3 and annealed, the permeation of the boron atoms into the semiconductor substrate 1 is observed noticeably.

To suppress the boron atoms from permeating the semiconductor substrate 1, various measures have been taken; a silicon oxynitride film that can suppress the boron atom permeation to a certain degree is adopted as the gate insulating film 2.

However, even if the silicon oxynitride film is used as the gate insulating film 2, the boron atom permeation is not completely suppressible. Particularly, where the silicon oxynitride film is extremely thin (less than 3 nm, for example) to catch up with performance enhancement of devices, the silicon oxynitride film can suppress the boron atom permeation just slightly to say the least.

SUMMARY OF THE INVENTION

It is therefore an object of the present invention to prevent a dopant introduced into a gate electrode from permeating a semiconductor substrate.

To achieve this object, a first inventive semiconductor device includes a gate electrode that has been formed over a semiconductor substrate with a gate insulating film interposed between the gate electrode and the substrate. The gate electrode includes: a silicon germanium layer; and an upper silicon layer that has been formed on the silicon germanium layer.

In the first inventive device, a gate electrode includes: a silicon germanium layer; and an upper silicon layer that has been formed on the silicon germanium layer. Thus, in doping the gate electrode with a dopant such as boron, the dopant can be introduced by an ion implantation process into the silicon germanium layer through the upper silicon layer. So, the dopant can be implanted sufficiently shallow while the penetration of the dopant into a semiconductor substrate, which is usually caused by a channeling phenomenon, is suppressible. Accordingly, it is possible to prevent the dopant, with which the gate electrode has been doped, from permeating the semiconductor substrate even if the gate electrode is subsequently subjected to an annealing process, for example. As a result, any variation in device characteristics, which might result from a change in dopant concentration in the semiconductor substrate, is suppressible.

Also, in the first inventive device, the bandgap of the silicon germanium layer for the gate electrode may be changed by controlling a germanium concentration in the silicon germanium layer. And the threshold voltage controllability of the gate electrode can be improved by changing the bandgap. In that case, the gate electrode does not have to be doped with any dopant. As a result, any variation in device characteristics, which might result from the permeation of a dopant from the gate electrode into the semiconductor substrate, is suppressible with more certainty.

Further, in the first inventive device, since the silicon germanium layer is covered with the upper silicon layer, cross contamination (contamination of the semiconductor substrate or a reactor), caused by germanium atoms released from the silicon germanium layer, is also suppressible. Accordingly, a process for forming a gate electrode out of silicon layers can be utilized.

In one embodiment of the present invention, the gate electrode may further include a lower silicon layer under the silicon germanium layer.

In such an embodiment, the lower silicon layer with a surface morphology better than that of the silicon germanium layer exists under the silicon germanium layer for the gate electrode. Thus, the breakdown strength of the gate insulating film can be improved compared to a situation where the silicon germanium layer and the gate insulating film are in direct contact with each other.

In another embodiment, the gate electrode may further include a metal layer on the upper silicon layer, and a silicon nitride film may have been formed over the gate electrode.

Then, the gate electrode is implementable as a poly-metal gate electrode. And even though the silicon nitride film has been formed over the gate electrode, any dopant existing in the gate electrode hardly permeates the semiconductor substrate.

In this particular embodiment, an insulating layer preferably exists between the gate electrode and the silicon nitride film.

In that case, the dopant, existing in the gate electrode, even less likely permeates the semiconductor substrate when the insulating layer is made of silicon dioxide, for example.

A second inventive semiconductor device includes a gate electrode that has been formed over a semiconductor substrate with a gate insulating film interposed between the gate electrode and the substrate. The gate electrode includes a silicon germanium layer that has been deposited in an amorphous state.

In the second inventive device, a gate electrode includes a silicon germanium layer that has been deposited in an amorphous state. Thus, in doping the gate electrode with a dopant such as boron, the dopant can be introduced by an ion implantation process into the silicon germanium layer in the amorphous state. So, the dopant can be implanted sufficiently shallow while the penetration of the dopant into a semiconductor substrate, which is usually caused by a channeling phenomenon, is suppressible. Accordingly, it is possible to prevent the dopant, with which the gate electrode has been doped, from permeating the semiconductor substrate even if the gate electrode is subsequently subjected to an annealing process, for example. As a result, any variation in device characteristics, which might result from a change in dopant concentration in the semiconductor substrate, is suppressible.

Also, in the second inventive device, the bandgap of the silicon germanium layer for the gate electrode may be changed by controlling a germanium concentration in the silicon germanium layer. And the threshold voltage controllability of the gate electrode can be improved by changing the bandgap. In that case, the gate electrode does not have to be doped with any dopant. As a result, any variation in device characteristics, which might result from the permeation of a dopant from the gate electrode into the semiconductor substrate, is suppressible with more certainty.

Further, in the second inventive device, the silicon germanium layer in the amorphous state for the gate electrode has a better surface morphology than a silicon germanium layer in a polycrystalline state. Accordingly, the silicon germanium layer has a good surface morphology near the interface with the gate insulating film. Thus, the breakdown strength of the gate insulating film improves.

Furthermore, in the second inventive device, the gate electrode may be made of the silicon germanium layer alone. For that reason, the process steps of forming the gate electrode can be simplified as compared to forming a gate electrode with a multilayer structure, and the gate electrode can also have its thickness reduced to e.g., 100 nm or less.

In one embodiment of the present invention, the gate electrode may further include a metal layer on the silicon germanium layer, and a silicon nitride film may have been formed over the gate electrode.

In such an embodiment, the gate electrode is implementable as a poly-metal gate electrode. And even though the silicon nitride film has been formed over the gate electrode, any dopant existing in the gate electrode hardly permeates the semiconductor substrate.

In this particular embodiment, an insulating layer preferably exists between the gate electrode and the silicon nitride film.

In that case, the dopant, existing in the gate electrode, even less likely permeates the semiconductor substrate when the insulating layer is made of silicon dioxide, for example.

In one embodiment of the first or second inventive device, a germanium concentration in a part of the silicon germanium layer near a lower surface thereof is preferably lower than a germanium concentration in the other part of the silicon germanium layer.

In such an embodiment, it is possible to prevent the gate insulating film from decreasing its breakdown strength or changing its characteristics while suppressing decrease in the threshold voltage controllability of the gate electrode.

In another embodiment of the first or second inventive device, the silicon germanium layer may contain boron or phosphorus.

Then, the threshold voltage controllability of the gate electrode can be improved. Also, where the silicon germanium layer contains boron, the boron atoms existing in the silicon germanium layer are activated at a higher rate than in a normal polysilicon film. Thus the boron atoms will even less likely permeate the semiconductor substrate.

In another embodiment of the first or second inventive device, a silicon nitride film may have been formed over the gate electrode with an insulating layer interposed between the gate electrode and the silicon nitride film.

Then, even though the silicon nitride film has been formed over the gate electrode, any dopant existing in the gate electrode hardly permeates the semiconductor substrate.

In another embodiment of the first or second inventive device, the gate electrode may be used as a gate electrode for at least one of two MOS transistors in a dual-gate MOS device.

Then, it is possible to prevent a dopant introduced into a $p^+$ or $n^+$ gate electrode for one of the two MOS transistors in the dual-gate CMOS device from permeating the semiconductor substrate. Thus, any variation in the characteristics of the dual-gate CMOS device, which might result from a change in dopant concentration in the semiconductor substrate, is suppressible. Also, the bandgap of the silicon germanium layer of the $p^+$ or $n^+$ gate electrode may be changed by controlling a germanium concentration in the silicon germanium layer. And the threshold voltage controllability of the $p^+$ or $n^+$ gate electrode can be improved by changing the bandgap. In that case, the $p^+$ or $n^+$ gate electrode does not have to be doped with any dopant. That is to say, just by controlling the germanium concentration in the silicon germanium layer of the $p^+$ or $n^+$ gate electrodes it is possible to form a dual-gate CMOS device easily while preventing the penetration or permeation of any dopant into the semiconductor substrate.

A first inventive method for fabricating a semiconductor device includes the step of a) depositing a silicon germanium layer over a semiconductor substrate with a gate insulating film interposed between the substrate and the silicon germanium layer. The method further includes the step of b) depositing an upper silicon layer in an amorphous state on the silicon germanium layer. And the method further includes the step of c) forming a gate electrode by patterning the silicon germanium layer and the upper silicon layer.

According to the first inventive method, a silicon germanium layer and an upper silicon layer in an amorphous state are deposited in this order over a semiconductor substrate with a gate insulating film interposed between the substrate and the silicon germanium layer. Then, a gate electrode is formed by patterning the silicon germanium layer and the upper silicon layer. Thus, in doping the gate electrode with a dopant such as boron, the dopant can be introduced by an ion implantation process into the silicon germanium layer through the upper silicon layer in the amorphous state. So, the dopant can be implanted sufficiently shallow while the penetration of the dopant into the semiconductor substrate, which is usually caused by a channeling phenomenon, is suppressible. Accordingly, it is possible to prevent the dopant, with which the gate electrode has been doped, from permeating the semiconductor substrate even if the gate electrode is subsequently subjected to an annealing process, for example. As a result, any variation in device characteristics, which might result from a change in dopant concentration in the semiconductor substrate, is suppressible.

Also, according to the first inventive method, the bandgap of the silicon germanium layer for the gate electrode may be changed by controlling a germanium concentration in the silicon germanium layer. And the threshold voltage controllability of the gate electrode can be improved by changing the bandgap. In that case, the gate electrode does not have to be doped with any dopant. As a result, any variation in device characteristics, which might result from the permeation of a dopant from the gate electrode into the semiconductor substrate, is suppressible with more certainty.

Further, according to the first inventive method, since the silicon germanium layer is covered with the upper silicon layer, cross contamination, caused by germanium atoms released from the silicon germanium layer, is also suppressible. Accordingly, a process for forming a gate electrode out of silicon layers can be utilized.

In one embodiment of the present invention, the first method may further include the step of depositing a lower silicon layer on the gate insulating film before the step a) is performed, and the step c) may include patterning the lower silicon layer.

In such an embodiment, the lower silicon layer with a surface morphology better than that of the silicon germanium layer exists under the silicon germanium layer for the gate electrode. Thus, the breakdown strength of the gate insulating film can be improved compared to a situation where the silicon germanium layer and the gate insulating film are in direct contact with each other.

In another embodiment, the first method may further include the step of d) depositing a metal layer and a silicon nitride film in this order on the upper silicon layer between the steps b) and c), and the step c) may include patterning the silicon nitride film and then patterning the metal layer by using the patterned silicon nitride film as a mask.

Then, the gate electrode is implementable as a poly-metal gate electrode. And even though the silicon nitride film has been formed over the gate electrode, any dopant existing in the gate electrode hardly permeates the semiconductor substrate.

In this particular embodiment, the step d) preferably includes depositing an insulating layer between the metal layer and the silicon nitride film.

In that case, the dopant, existing in the gate electrode, even less likely permeates the semiconductor substrate when the insulating layer is made of silicon dioxide, for example.

A second inventive method for fabricating a semiconductor device includes the step of a) depositing a silicon germanium layer in an amorphous state over a semiconductor substrate with a gate insulating film interposed between the substrate and the silicon germanium layer. The method further includes the step of b) forming a gate electrode by patterning the silicon germanium layer.

According to the second inventive method, a silicon germanium layer in an amorphous state is deposited over a semiconductor substrate with a gate insulating film interposed between the substrate and the silicon germanium layer. Then, a gate electrode is formed by patterning the silicon germanium layer. Thus, in doping the gate electrode with a dopant such as boron, the dopant can be introduced by an ion implantation process into the silicon germanium layer in the amorphous state. So, the dopant can be implanted sufficiently shallow while the penetration of the dopant into the semiconductor substrate, which is usually caused by a channeling phenomenon, is suppressible. Accordingly, it is possible to prevent the dopant, with which the gate electrode has been doped, from permeating the semiconductor substrate even if the gate electrode is subsequently subjected to an annealing process, for example. As a result, any variation in device characteristics, which might result from a change in dopant concentration in the semiconductor substrate, is suppressible.

Also, according to the second inventive method, the bandgap of the silicon germanium layer for the gate electrode may be changed by controlling a germanium concentration in the silicon germanium layer. And the threshold voltage controllability of the gate electrode can be improved by changing the bandgap. In that case, the gate electrode does not have to be doped with any dopant. As a result, any variation in device characteristics, which might result from the permeation of a dopant from the gate electrode into the semiconductor substrate, is suppressible with more certainty.

Further, according to the second inventive method, the silicon germanium layer in the amorphous state for the gate electrode has a better surface morphology than a silicon germanium layer in a polycrystalline state. Accordingly, the silicon germanium layer has a good surface morphology near the interface with the gate insulating film. Thus, the breakdown strength of the gate insulating film improves.

Furthermore, according to the second inventive method, the gate electrode may be made of the silicon germanium layer alone. Thus, the process steps of forming the gate electrode can be simplified as compared to forming a gate electrode with a multilayer structure, and the gate electrode can also have its thickness reduced to e.g., 100 nm or less.

In one embodiment of the present invention, the second method may further include the step of c) depositing a metal layer and a silicon nitride film in this order on the silicon germanium layer between the steps a) and b). And the step b) may include patterning the silicon nitride film and then patterning the metal layer by using the patterned silicon nitride film as a mask.

In such an embodiment, the gate electrode is implementable as a poly-metal gate electrode. And even though the silicon nitride film has been formed over the gate electrode, any dopant existing in the gate electrode hardly permeates the semiconductor substrate.

In this particular embodiment, the step c) preferably includes depositing an insulating layer between the metal layer and the silicon nitride film.

In that case, the dopant, existing in the gate electrode, even less likely permeates the semiconductor substrate when the insulating layer is made of silicon dioxide, for example.

In one embodiment of the first or second inventive method, the step a) may include: supplying a first source gas containing silicon and a second source gas containing germanium; and changing a mixture ratio of the first and second source gases with time, thereby setting a germanium concentration in a part of the silicon germanium layer near a lower surface thereof lower than a germanium concentration in the other part of the silicon germanium layer.

In such an embodiment, it is possible to prevent the gate insulating film from decreasing its breakdown strength or changing its characteristics while suppressing decrease in the threshold voltage controllability of the gate electrode.

In another embodiment of the first or second inventive method, the silicon germanium layer may contain boron or phosphorus.

Then, the threshold voltage controllability of the gate electrode can be improved. Also, where the silicon germanium layer contains boron, the boron atoms existing in the silicon germanium layer are activated at a higher rate than in a normal polysilicon film. Thus the boron atoms will even less likely permeate the semiconductor substrate.

In another embodiment, the first or second inventive method may further include the step of implanting boron or phosphorus ions into the silicon germanium layer.

Then, the silicon germanium layer can be doped with boron or phosphorus with certainty.

In an alternative embodiment of the first or second inventive method, the step a) may include supplying a gas containing silicon, a gas containing germanium and a gas containing boron or phosphorus, thereby depositing the silicon germanium layer containing boron or phosphorus.

Then, the silicon germanium layer can also be doped with boron or phosphorus with certainty. In addition, the silicon germanium layer can be doped with boron or phosphorus without performing an ion implantation process thereon. So, the penetration of the boron or phosphorus atoms into the semiconductor substrate, which is usually caused by a channeling phenomenon, does not arise. That is to say, no boron or phosphorus atoms permeate the semiconductor substrate even when an annealing process is carried out after that on the boron or phosphorus ions implanted.

In another embodiment, the first or second inventive method may further include the step of depositing a silicon nitride film over the gate electrode with an insulating layer interposed between the gate electrode and the silicon nitride film.

Then, even though the silicon nitride film has been formed over the gate electrode, any dopant existing in the gate electrode hardly permeates the semiconductor substrate.

In another embodiment of the first or second inventive method, the gate electrode may be used as a gate electrode for at least one of two MOS transistors in a dual-gate MOS device.

Then, it is possible to prevent a dopant introduced into a $p^+$ or $n^+$ gate electrode for one of the two MOS transistors in the dual-gate CMOS device from permeating the semiconductor substrate. Thus, any variation in the characteristics of the dual-gate CMOS device, which might result from a change in dopant concentration in the semiconductor substrate, is suppressible. Also, the bandgap of the silicon germanium layer of the $p^+$ or $n^+$ gate electrode may be changed by controlling a germanium concentration in the silicon germanium layer. And the threshold voltage controllability of the $p^+$ or $n^+$ gate electrode can be improved by changing the bandgap. In that case, the $p^+$ or $n^+$ gate electrode does not have to be doped with any dopant. That is to say, just by controlling the germanium concentration in the silicon germanium layer of the $p^+$ or $n^+$ gate electrode, it is possible to form a dual-gate CMOS device easily while preventing the penetration or permeation of any dopant into the semiconductor substrate.

DESCRIPTION OF THE PREFERRED EMBODIMENTS

EMBODIMENT 1

Hereinafter, a semiconductor device and a method for fabricating the device in accordance with a first embodiment of the present invention will be described with reference to the accompanying drawings.

FIGS. 1A through 1D are cross-sectional views corresponding to respective process steps for fabricating a semiconductor device in accordance with the first embodiment.

Figure 1A:
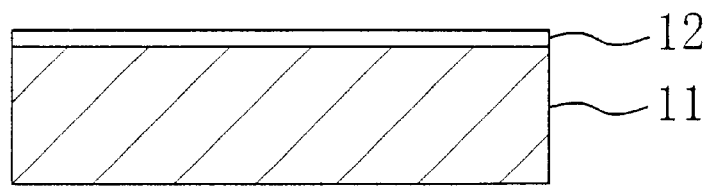
FIGS. 1A through 1D are cross-sectional views corresponding to respective process steps for fabricating a semiconductor device in accordance with a first embodiment of the present invention.

First, as shown in FIG. 1A, a gate insulating film 12 is deposited to a thickness of about 3 nm, for example, on a silicon substrate 11 of a conductivity type.

Figure 1B:
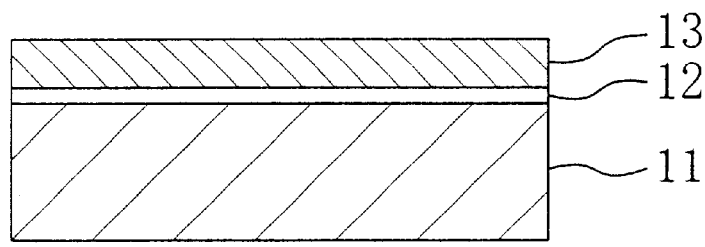

Next, as shown in FIG. 1B, a silicon germanium layer 13 (which will be herein called an "SiGe layer") is deposited to a thickness of 100 nm, for example, on the gate insulating film 12 by an LPCVD (low-pressure chemical vapor deposition) process. In this process, a source gas containing silicon (which will be herein called as an "Si source gas") and a source gas containing germanium (which will be herein called a "Ge source gas") are supplied at a temperature of about 600° C. or less.

In this case, $SiH_4$ (mono silane) or $Si_2H_6$ (disilane) gas, for example, may be used as the Si source gas. $GeH_4$ gas, for example, may be used as the Ge source gas. In this process step, the Ge concentration (which will be herein represented by mass percentage) in the SiGe layer 13 is controllable by changing the mixture ratio of the Si and Ge source gases. For example, the SiGe layer 13 can have a Ge concentration of about 50% by supplying the $SiH_4$ and $GeH_4$ gases at a flow rate ratio of one to five.

Figure 1C:
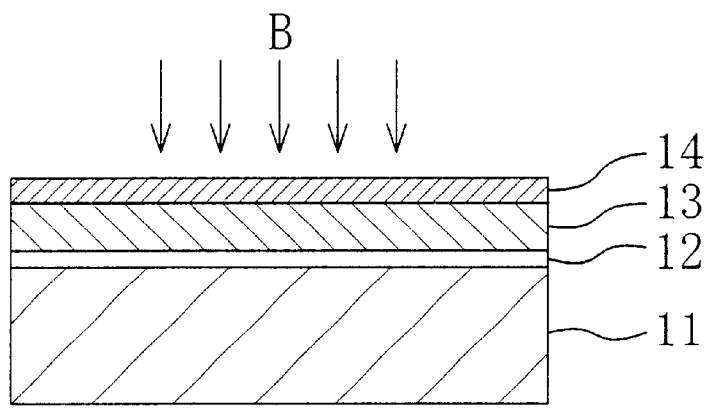

Next, as shown in FIG. 1C, a silicon layer 14 (which will be herein called an "Si layer") in an amorphous state is deposited to a thickness of 40 nm, for example, on the SiGe layer 13 by an LPCVD process with an Si source gas supplied at a temperature of about 500° C. In this process step, the Si layer 14 may be deposited continuously in the chamber where the SiGe layer 13 has been deposited by changing the source gases, for example. Or the SiGe and Si layers 13 and 14 may be deposited in mutually different chambers either successively or as completely independent process steps.

Then, as shown in FIG. 1C, boron ions are implanted into the SiGe layer 13 at an acceleration voltage of 5 keV and at a dose of $1 \times 10^{15}/cm^2$.

Figure 1D:
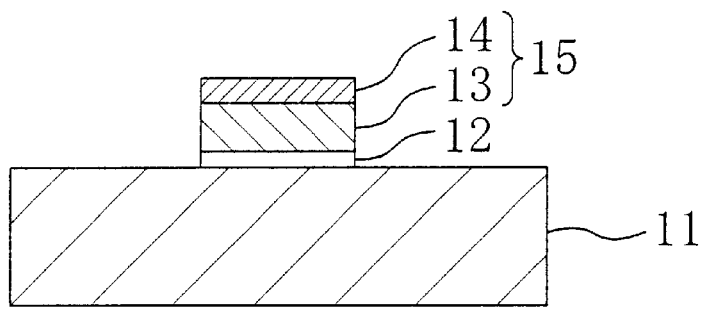

Next, as shown in FIG. 1D, the Si layer 14, SiGe layer 13 and gate insulating film 12 are sequentially etched by using a mask pattern (not shown), which covers part of the substrate where a gate electrode will be formed, thereby forming a gate electrode 15 consisting of the SiGe and Si layers 13 and 14 over the silicon substrate 11 with the gate insulating film 12 interposed between them.

In the first embodiment, after the Si layer 14 was formed and until boron ions have been implanted into the SiGe layer 13, no process steps requiring annealing are carried out to keep the Si layer 14 amorphous. Thus it is possible to prevent the boron atoms, existing in the SiGe layer 13, from penetrating into the silicon substrate 11 or the boron ions from being implanted too deep. After the boron ions have been implanted into the SiGe layer 13, however, the Si layer 14 will be polycrystalline in the end because the Si layer 14 will be annealed in the process step of depositing an inter-level dielectric film on the gate electrode 15, for example.

As described above, according to the first embodiment, an SiGe layer 13 and then an Si layer 14 in an amorphous state are deposited in this order over a silicon substrate 11 with a gate insulating film 12 interposed between the SiGe layer 13 and the silicon substrate 11. Then, boron ions are implanted into the SiGe layer 13. Thereafter, the SiGe and Si layers 13 and 14 are patterned to form a gate electrode 15. Thus, the boron ions are implanted into the SiGe layer 13 through the Si layer 14 in the amorphous state; the boron ions can be implanted sufficiently shallow while the penetration of the boron atoms into the silicon substrate 11, which is usually caused by a channeling phenomenon, is suppressible. Accordingly, it is possible to prevent the boron atoms, with which the SiGe layer 13 for the gate electrode 15 has been doped, from permeating the silicon substrate 11 even if the SiGe layer 13 is subsequently annealed, for example. As a result, any variation in device characteristics, which might result from a change in dopant concentration in the silicon substrate 11, is suppressible.

Figure 2:
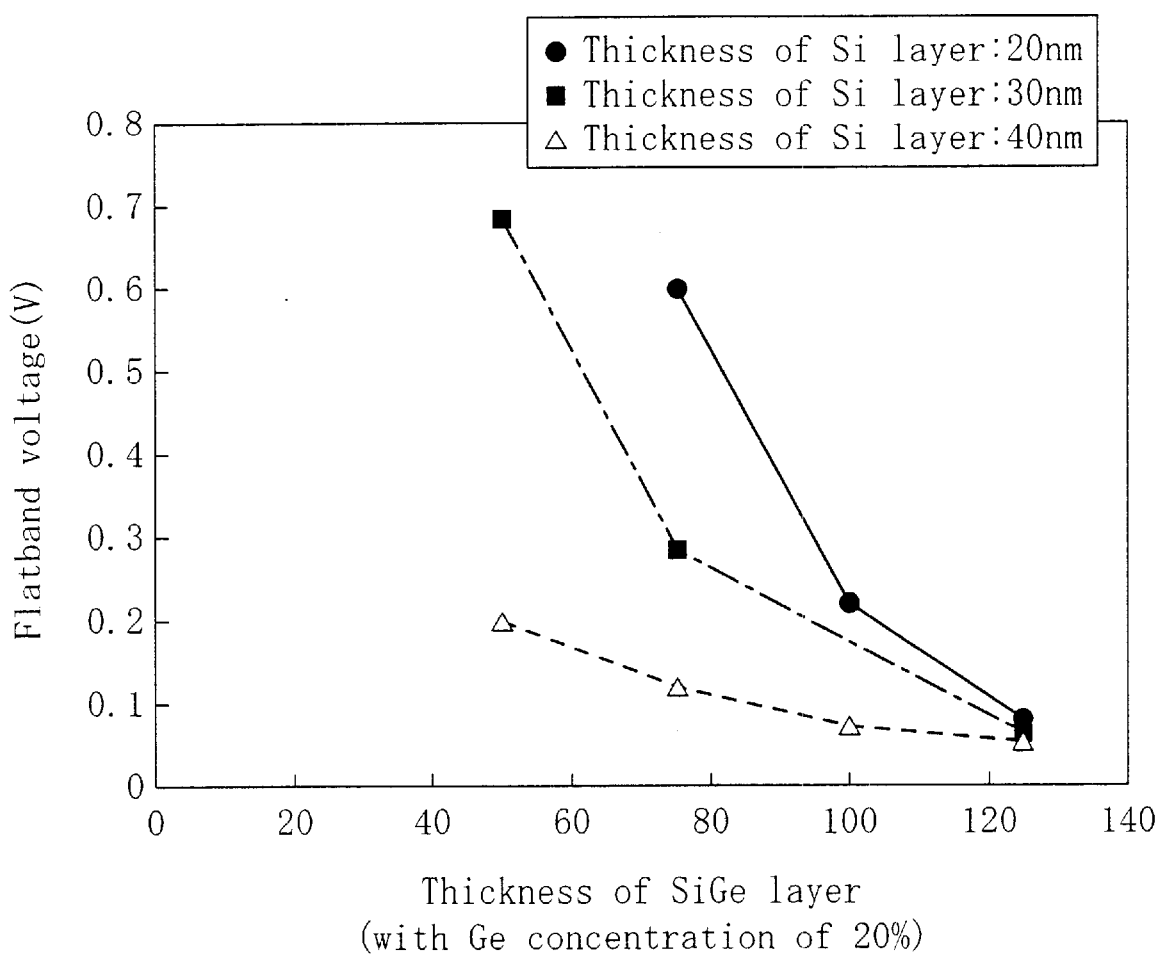
FIG. 2 is a graph illustrating how the flatband voltage of the gate electrode changes with the thickness of the SiGe layer in the semiconductor device of the first embodiment.

FIG. 2 illustrates how the flatband voltage (which will be herein called "Vfb") of the gate electrode 15 changes with the thickness of the SiGe layer 13. The data shown in FIG. 2 was obtained where the thickness of the gate insulating film 12 was about 3 nm, the Ge concentration in the SiGe layer 13 was about 20% and the boron ions were implanted at an acceleration voltage of about 5 keV. In FIG. 2, the solid circles connected with solid lines, the solid squares connected with one-dot chains, and the open triangles connected with dashed lines show how Vfb changed where the thickness of the Si layer 14 was 20, 30 and 40 nm, respectively.

As shown in FIG. 2, as for an Si layer 14 with a thickness of 20 nm, if the SiGe layer had a thickness of 75, 100 and 125 nm, Vfb was 0.598, 0.217 and 0.079 V, respectively. As for an Si layer 14 with a thickness of 30 nm, if the SiGe layer had a thickness of 50, 75 and 125 nm, Vfb was 0.683, 0.282 and 0.062 V, respectively. As for an Si layer 14 with a thickness of 40 nm, if the SiGe layer had a thickness of 50, 75, 100 and 125 nm, Vfb was 0.201, 0.121, 0.074 and 0.054 V, respectively. The lower the flatband voltage Vfb, the smaller the quantity of boron atoms permeating. Thus where the SiGe layer 13 has a thickness of about 80 nm, the permeation of the boron atoms into the silicon substrate 11 is sufficiently suppressible by setting the thickness of the Si layer 14 at about 30 nm or more.

Further, according to the first embodiment, the SiGe layer 13 for the gate electrode 15 is doped with the boron ions, so the threshold voltage (which will be herein called "Vt") controllability of the gate electrode 15 improves.

Also, according to the first embodiment, the boron atoms in the SiGe layer 13 are activated at a higher rate than in a normal polysilicon film. Thus the boron atoms will much less likely permeate the silicon substrate 11.

Furthermore, according to the first embodiment, since the SiGe layer 13 is covered with the Si layer 14, cross contamination, caused by the Ge atoms released from the SiGe layer 13, is also suppressible. Accordingly, a process for forming a gate electrode out of Si layers (which will be herein called an "Si process") can be utilized.

In addition, although boron ions are implanted into the SiGe layer 13 in the first embodiment, phosphorus (P) ions may also be implanted instead (e.g., at an acceleration voltage of 10 keV and at a dose of $5 \times 10^{15}/cm^2$). Or boron and phosphorus ions may be both implanted at a time. Also, instead of doping the SiGe layer 13 with boron or phosphorus by an ion implantation process after the SiGe layer 13 has been deposited, the SiGe layer 13 containing boron or phosphorous may be deposited by supplying not only Si and Ge source gases but also a gas containing boron or phosphorus ($B_2H_6$ gas, for example) during the deposition process thereof. Or the SiGe layer 13 may also be doped with boron or phosphorus by thermally diffusing phosphine ($PH_3$), for example, after the SiGe layer 13 has been deposited.

Also, in the first embodiment, the process step of doping the SiGe layer 13 with boron, for example, may be omitted. Specifically, the bandgap of the SiGe layer 13 for the gate electrode 15 can be changed by controlling the Ge concentration in the SiGe layer 13. Accordingly, the Vt controllability of the gate electrode 15 can be improved without doping the SiGe layer 13 with boron, for example. As a result, even in applying this embodiment to forming a dual-gate CMOS device, there is no concern about the permeation of any dopant, e.g., boron. Further, in that case, the Si layer 14 does not have to be deposited in an amorphous state, nor does the Si layer 14 have to be kept amorphous until a dopant such as boron has been introduced.

Further, in the first embodiment, the SiGe layer 13 may also be deposited in an amorphous state by an LPCVD process where Si and Ge source gases are supplied at a temperature of about 500° C. or less. Then, the boron atoms will even less likely permeate the silicon substrate 11.

MODIFIED EXAMPLE OF EMBODIMENT 1

Hereinafter, a semiconductor device and a method for fabricating the device in accordance with a modified example of the first embodiment will be described with reference to the accompanying drawings.

The method of this modified example differs from that of the first embodiment in that the Ge concentration in the SiGe layer 13 is changed in the depth direction by changing the mixture ratio of Si and Ge source gases with time in the process step of depositing the SiGe layer 13 (see FIG. 1B).

Specifically, the SiGe layer 13 may have a Ge concentration of about 10%, for example, near the lower surface thereof (i.e., part of the SiGe layer 13, close to the interface with the gate insulating film 12) by setting the ratio of the Ge source gas very low or to zero for a while after the SiGe layer 13 started to grow. On the other hand, the SiGe layer 13 may have a Ge concentration of about 70%, for example, near the upper surface thereof by increasing the ratio of the Ge source gas as the SiGe layer 13 grows thicker.

Figure 3A:
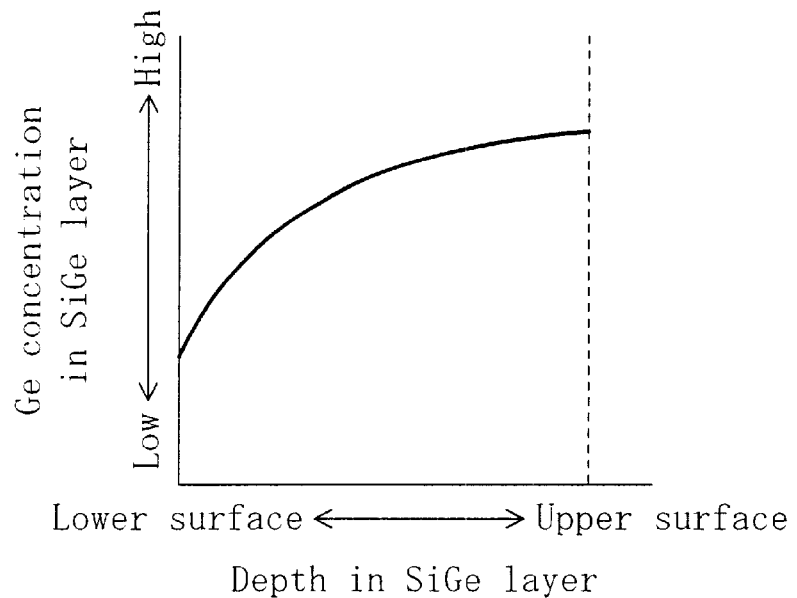
FIG. 3A is a graph illustrating how the Ge concentration in the SiGe layer continuously changes in the depth direction in a semiconductor device in accordance with a modified example of the first embodiment.
Figure 3B:
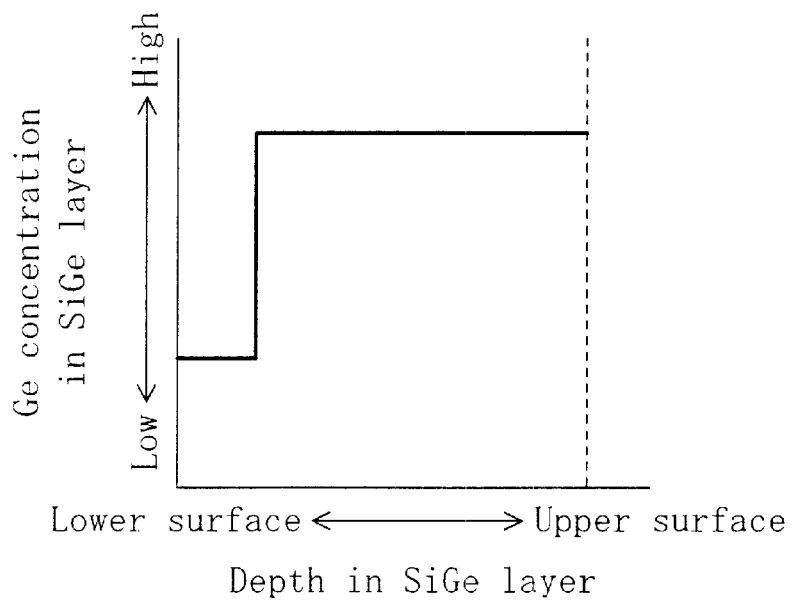
FIG. 3B is a graph illustrating how the Ge concentration in the SiGe layer discontinuously changes in the depth direction in the semiconductor device of the modified example of the first embodiment.

In this process, since the Ge concentration is much lower, the surface morphology of the SiGe layer 13 improves, thus the interface between the gate insulating film 12 and the SiGe layer 13 has almost no unevenness. In other words, no too dense electric fields are distributed around the interface. Accordingly, it is possible to prevent the breakdown strength of the gate insulating film 12 from decreasing. Also, the gate insulating film 12 is not exposed to the Ge source gas with a high concentration for sometime after the SiGe layer 13 started to grow. Thus, variation in characteristics of the gate insulating film 12 is avoidable. Further, the overall Ge concentration in the SiGe layer 13 for the gate electrode 15 does not decrease, nor does the Vt controllability of the gate electrode 15 for that reason.

Where the Ge source gas is supplied at various ratios increasing along with the growth of the SiGe layer 13, the Ge source gas ratio may be increased either continuously or discontinuously to change the Ge concentration in the SiGe layer 13 continuously or discontinuously in the depth direction as shown in FIG. 3A or 3B.

According to the modified example of the first embodiment, the following effects are attainable in addition to the effects of the first embodiment.

Specifically, in this modified example, the SiGe layer 13 can have a lower Ge concentration near the lower surface thereof as compared to the other part thereof by changing the mixture ratio of Si and Ge source gases with time in the process step of depositing the SiGe layer 13. For this reason, it is possible to prevent the gate insulating film 12 from decreasing its breakdown strength or changing its characteristics while suppressing decrease in the Vt controllability of the gate electrode 15.

EMBODIMENT 2

Hereinafter, a semiconductor device and a method for fabricating the device in accordance with a second embodiment of the present invention will be described with reference to the accompanying drawings.

FIGS. 4A through 4D are cross-sectional views corresponding to respective process steps for fabricating a semiconductor device in accordance with the second embodiment.

Figure 4A:
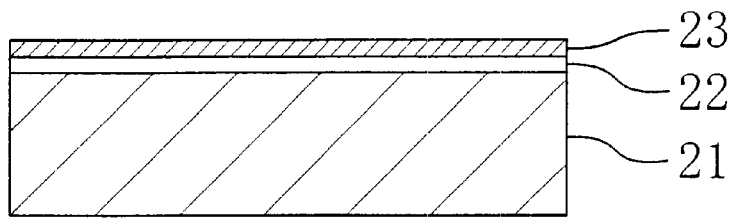
FIGS. 4A through 4D are cross-sectional views corresponding to respective process steps for fabricating a semiconductor device in accordance with a second embodiment of the present invention.

First, as shown in FIG. 4A, a gate insulating film 22 is deposited to a thickness of about 3 nm, for example, on a silicon substrate 21 of a conductivity type. Then, a lower silicon layer 23 (which will be herein called a "lower Si layer") in an amorphous state is deposited to a thickness of 10 nm, for example, on the gate insulating film 22 by an LPCVD process with an Si source gas such as $SiH_4$ gas supplied at a temperature of about 500° C.

Figure 4B:
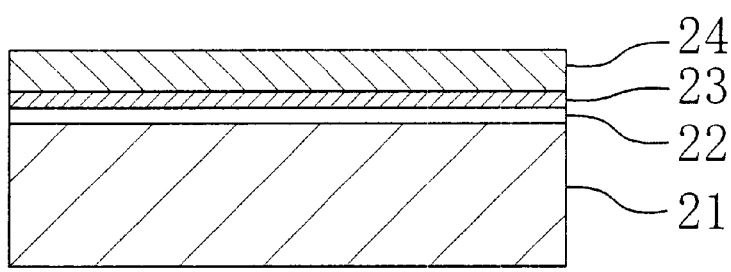

Next, as shown in FIG. 4B, an SiGe layer 24 is deposited to a thickness of 100 nm, for example, on the lower Si layer 23 by an LPCVD process with Si and Ge source gases supplied at a temperature of about 600° C. or less. In this process step, the Ge concentration in the SiGe layer 24 is controllable by changing the mixture ratio of the Si and Ge source gases.

Figure 4C:
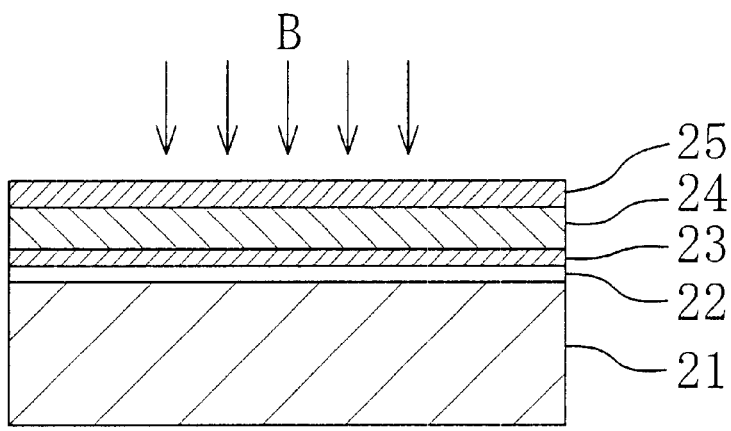

Next, as shown in FIG. 4C, an upper silicon layer 25 (which will be herein called an "upper Si layer") in an amorphous state is deposited to a thickness of 40 nm, for example, on the SiGe layer 24 by an LPCVD process with an Si source gas supplied at a temperature of about 500° C.

It should be noted that the lower or upper Si layer 23 or 25 may be deposited continuously in the chamber where the SiGe layer 24 will be or has been deposited, respectively, by changing the source gases, for example. Or the lower or upper Si layer 23 or 25 and the SiGe layer 24 may be deposited in mutually different chambers either successively or as completely independent process steps.

Then, as shown in FIG. 4C, boron ions are implanted into the SiGe layer 24 at an acceleration voltage of 5 keV and at a dose of $1 \times 10^{15}/cm^2$.

Figure 4D:
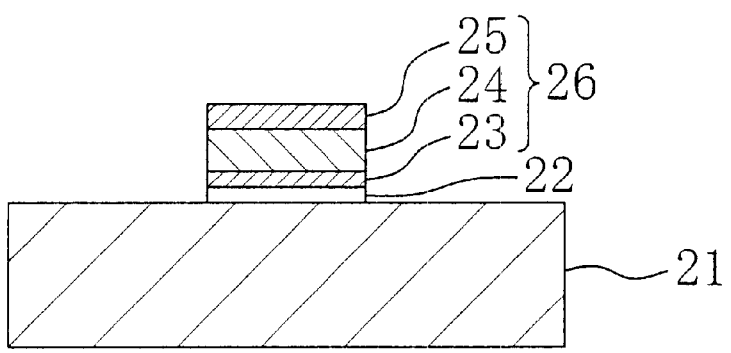

Next, as shown in FIG. 4D, the upper Si layer 25, SiGe layer 24, lower Si layer 23 and gate insulating film 22 are sequentially etched by using a mask pattern (not shown), which covers part of the substrate where a gate electrode will be formed, thereby forming a gate electrode 26 consisting of the lower Si, SiGe and upper Si layers 23, 24 and 25 over the silicon substrate 21 with the gate insulating film 22 interposed between them.

In the second embodiment, after the upper Si layer 25 was formed and until boron ions have been implanted into the SiGe layer 24, no process steps requiring annealing are carried out to keep the upper Si layer 25 amorphous. Thus it is possible to prevent the boron atoms, existing in the SiGe layer 24, from penetrating into the silicon substrate 21 or the boron ions from being implanted too deep. After the boron ions have been implanted into the SiGe layer 24, however, the upper Si layer 25 will be polycrystalline in the end because the upper Si layer 25 will be annealed in the process step of depositing an interlevel dielectric film on the gate electrode 26, for example.

As described above, according to the second embodiment, a lower Si layer 23 in an amorphous state, SiGe layer 24 and upper Si layer 25 in an amorphous state are deposited in this order over a silicon substrate 21 with a gate insulating film 22 interposed between the lower Si layer 23 and the silicon substrate 21. Then, boron ions are implanted into the SiGe layer 24. Thereafter, the lower Si, SiGe and upper Si layers 23, 24 and 25 are patterned to form a gate electrode 26. Thus, the boron ions are implanted into the SiGe layer 24 through the upper Si layer 25 in the amorphous state; the boron ions can be implanted sufficiently shallow while the penetration of the boron atoms into the silicon substrate 21, which is usually caused by a channeling phenomenon, is suppressible. Accordingly, it is possible to prevent the boron atoms, with which the SiGe layer 24 for the gate electrode 26 has been doped, from permeating the silicon substrate 21 even if the SiGe layer 24 is subjected to an annealing process, for example, after that. As a result, any variation in device characteristics, which might result from a change in dopant concentration in the silicon substrate 21, is suppressible. Also, the lower Si layer 23 with a surface morphology better than that of the SiGe layer 24 exists under the SiGe layer 24 of the gate electrode 26. Thus, the breakdown strength of the gate insulating film 22 (which will be herein called an "insulating film breakdown strength") can be kept high enough. Specifically, where the gate insulating film 22 and the SiGe layer 24 are in direct contact with each other, the interface between the gate insulating film 22 and the SiGe layer 24 has unevenness. For this reason, electric field is distributed too densely around the interface, which results in decrease in the insulating film breakdown strength. In contrast, the second embodiment can suppress such an unwanted phenomenon.

Further, according to the second embodiment, the SiGe layer 24 for the gate electrode 26 is doped with boron, so the Vt controllability of the gate electrode 26 improves.

Also, according to the second embodiment, the boron atoms in the SiGe layer 24 are activated at a higher rate than in a normal polysilicon film. Thus the boron atoms will much less likely permeate the silicon substrate 21.

Furthermore, according to the second embodiment, since the SiGe layer 24 is covered with the upper Si layer 25, cross contamination, caused by the Ge atoms released from the SiGe layer 24, is also suppressible. Accordingly, an Si process can be utilized.

Although boron ions are implanted into the SiGe layer 24 in the second embodiment, phosphorus ions may also be implanted instead (e.g., at an acceleration voltage of 10 keV and at a dose of $5 \times 10^5/cm^2$). Or boron and phosphorus ions may be both implanted at a time. Also, instead of doping the SiGe layer 24 with boron or phosphorus, for example, by an ion implantation process after the SiGe layer 24 has been deposited, the SiGe layer 24 containing boron or phosphorus, for example, may be deposited by supplying not only Si and Ge source gases but also a gas containing boron or phosphorus, for example, (e.g., $B_2H_6$ gas) during the deposition process thereof. Or the SiGe layer 24 may also be doped with boron or phosphorus, for example, by thermally diffusing $PH_3$, for example, after the SiGe layer 24 has been deposited.

Also, in the second embodiment, the process step of doping the SiGe layer 24 with boron, for example, may be omitted. Specifically, the bandgap of the SiGe layer 24 for the gate electrode 26 can be changed by controlling the Ge concentration in the SiGe layer 24. Accordingly, the Vt controllability of the gate electrode 26 can be improved without doping the SiGe layer 24 with boron, for example. As a result, even in applying this embodiment to forming a dual-gate CMOS device, there is no concern about the permeation of any dopant, e.g., boron. Further, in that case, the upper Si layer 25 does not have to be deposited in an amorphous state, nor does the upper Si layer 25 have to be kept amorphous until a dopant such as boron has been introduced.

Further, in the second embodiment, the SiGe layer 24 may also be deposited in an amorphous state by an LPCVD process where Si and Ge source gases are supplied at a temperature of about 500° C. or less. Then, the boron atoms will even less likely permeate the silicon substrate 21.

Also, in the second embodiment, the SiGe layer 24 may have a lower Ge concentration near the lower surface thereof as compared to the other part thereof by changing the mixture ratio of Si and Ge source gases with time in the process step of depositing the SiGe layer 24. Then, it is possible to prevent the gate insulating film 22 from decreasing its breakdown strength or changing its characteristics while suppressing decrease in the Vt controllability of the gate electrode 26.

MODIFIED EXAMPLE OF EMBODIMENT 2

Hereinafter, a semiconductor device and a method for fabricating the device in accordance with a modified example of the second embodiment will be described with reference to the accompanying drawings.

The method of this modified example differs from that of the second embodiment in the following respect.

Specifically, in the second embodiment, boron is introduced into the SiGe layer 24 by an ion implantation process after the SiGe layer 24 has been deposited. In this modified example, on the other hand, boron is introduced into the SiGe layer 24 during the deposition process thereof by supplying not only Si and Ge source gases but also a gas containing boron (which will be herein called a "B source gas") such as $B_2H_6$ gas.

FIGS. 5A through 5D are cross-sectional views corresponding to respective process steps for fabricating a semiconductor device in accordance with this modified example.

Figure 5A:
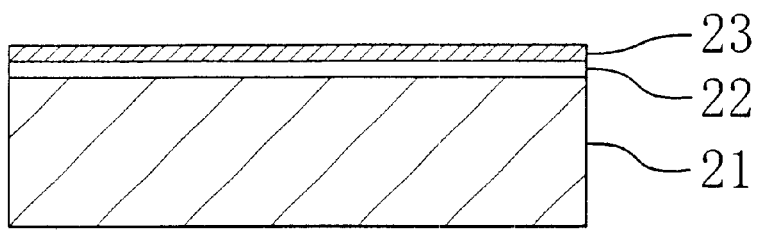
FIGS. 5A through 5D are cross-sectional views corresponding to respective process steps for fabricating a semiconductor device in accordance with a modified example of the second embodiment.

First, as shown in FIG. 5A, a gate insulating film 22 is deposited to a thickness of about 3 nm, for example, on a silicon substrate 21 of a conductivity type as in the process step shown in FIG. 4A for the second embodiment. Then, a lower Si layer 23 in an amorphous state is deposited to a thickness of 10 nm, for example, on the gate insulating film 22 by an LPCVD process with an Si source gas such as $SiH_4$ gas supplied at a temperature of about 500° C.

Figure 5B:
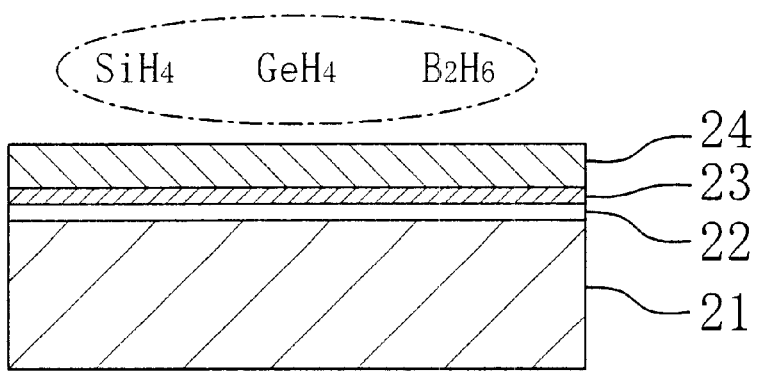

Next, as shown in FIG. 5B, an SiGe layer 24 containing boron is deposited to a thickness of 100 nm, for example, on the lower Si layer 23 by an LPCVD process with Si, Ge and B source gases supplied at a temperature of about 600° C. or less. In this process step, the Ge concentration in the SiGe layer 24 is controllable by changing the mixture ratio of the Si and Ge source gases.

Figure 5C:
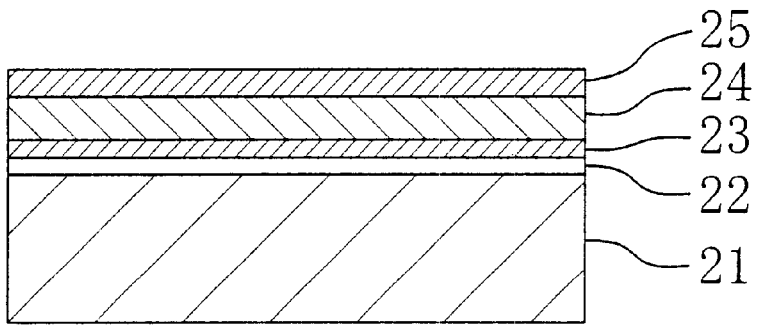

Then, as shown in FIG. 5C, an upper Si layer 25 in an amorphous state is deposited to a thickness of 40 nm, for example, on the SiGe layer 24 by an LPCVD process with an Si source gas supplied at a temperature of about 500° C. as in the second embodiment.

Figure 5D:
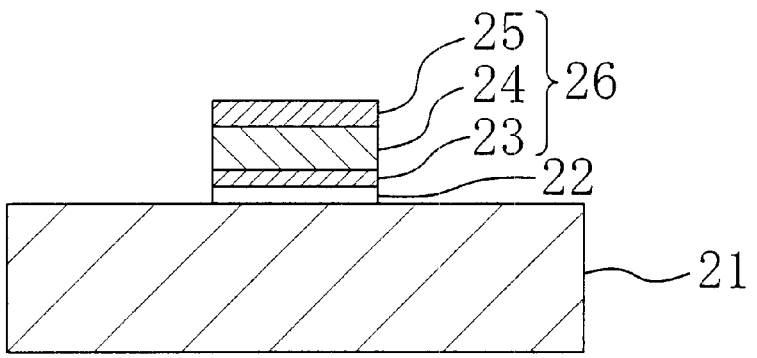

Subsequently, as in the second embodiment, the upper Si layer 25, SiGe layer 24, lower Si layer 23 and gate insulating film 22 are sequentially etched by using a mask pattern (not shown), which covers part of the substrate where a gate electrode will be formed, thereby forming a gate electrode 26 consisting of the lower Si, SiGe and upper Si layers 23, 24 and 25 over the silicon substrate 21 with the gate insulating film 22 interposed between them as shown in FIG. 5D.

According to the modified example of the second embodiment, the following effects are attainable in addition to the effects of the second embodiment.

Specifically, in this modified example, not only Si and Ge source gases but also a B source gas are supplied to deposit the SiGe layer 24 containing boron. Thus, the SiGe layer 24 can be doped with boron without performing an ion implantation process thereon. So, the penetration of the boron atoms into the silicon substrate 21, which is usually caused by a channeling phenomenon, does not arise. That is to say, no boron atoms permeate the silicon substrate 21 even when an annealing process is carried out after that on the boron ions implanted.

Although not only Si and Ge source gases but also a B source gas are supplied to deposit the SiGe layer 24 containing boron in this modified example, a gas containing phosphorous such as $PH_3$ gas may be supplied along with the Si and Ge source gases to deposit an SiGe layer containing phosphorous instead. Or not just the Si and Ge source gases but a gas containing both boron and phosphorous may be supplied to deposit an SiGe layer containing boron and phosphorous.

EMBODIMENT 3

Hereinafter, a semiconductor device and a method for fabricating the device in accordance with a third embodiment of the present invention will be described with reference to the accompanying drawings.

Figure 6A:
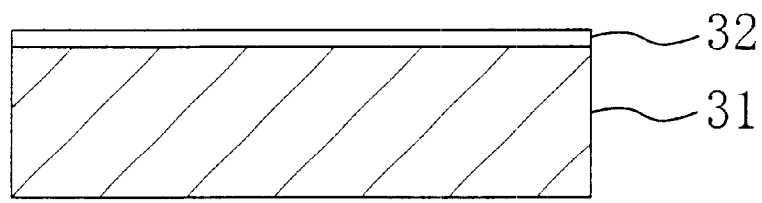
FIGS. 6A through 6C are cross-sectional views corresponding to respective process steps for fabricating a semiconductor device in accordance with a third embodiment of the present invention.
Figure 6B:
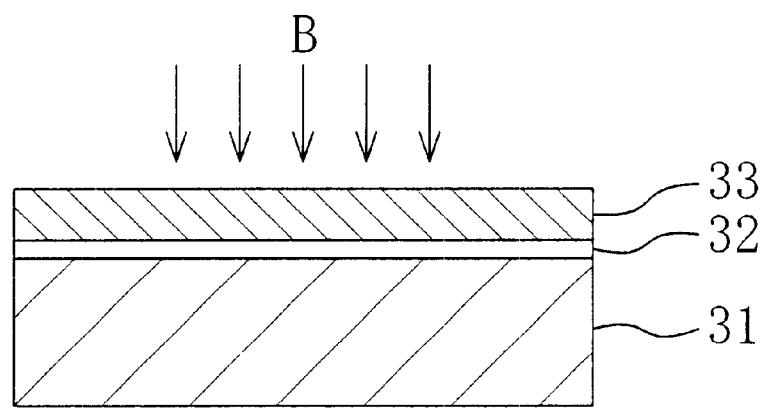
Figure 6C:
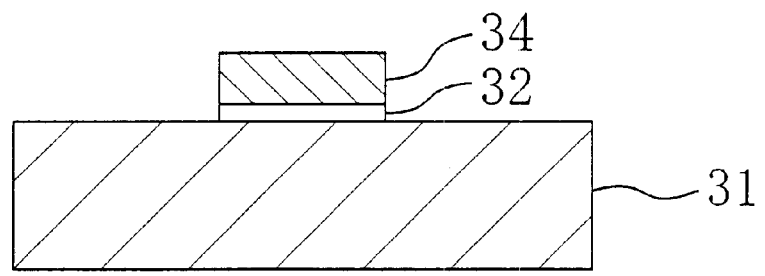

FIGS. 6A through 6C are cross-sectional views corresponding to respective process steps for fabricating a semiconductor device in accordance with the third embodiment.

First, as shown in FIG. 6A, a gate insulating film 32 is deposited to a thickness of about 3 nm, for example, on a silicon substrate 31 of a conductivity type.

Next, as shown in FIG. 6B, an SiGe layer 33 in an amorphous state is deposited to a thickness of about 100 nm, for example, on the gate insulating film 32 by an LPCVD process with Si and Ge source gases supplied at a temperature of about 500° C. or less. In this process step, the Ge concentration in the SiGe layer 33 is controllable by changing the mixture ratio of the Si and Ge source gases. Then, boron ions are implanted into the SiGe layer 33 at an acceleration voltage of 5 keV and at a dose of $1\times10^{15}/cm^2$.

Subsequently, the SiGe layer 33 and the gate insulating film 32 are sequentially etched by using a mask pattern (not shown), which covers part of the substrate where a gate electrode will be formed, thereby forming a gate electrode 34 out of the SiGe layer 33 over the silicon substrate 31 with the gate insulating film 32 interposed between them as shown in FIG. 6C.

In the third embodiment, after the SiGe layer 33 was formed and until boron ions have been implanted into the SiGe layer 33, no process steps requiring annealing are carried out to keep the SiGe layer 33 amorphous. Thus it is possible to prevent the boron atoms, existing in the SiGe layer 33, from penetrating into the silicon substrate 31 or the boron ions from being implanted too deep. After the boron ions have been implanted into the SiGe layer 33, however, the SiGe layer 33 will be polycrystalline in the end because the SiGe layer 33 will be annealed in the process step of depositing an interlevel dielectric film on the gate electrode 34, for example.

As described above, according to the third embodiment, an SiGe layer 33 in an amorphous state is deposited over a silicon substrate 31 with a gate insulating film 32 interposed between them. Then, boron ions are implanted into the SiGe layer 33. Thereafter, the SiGe layer 33 is patterned to form a gate electrode 34. Thus, the boron ions are implanted into the SiGe layer 33 in the amorphous state; the boron ions can be implanted sufficiently shallow while the penetration of the boron atoms into the silicon substrate 31, which is usually caused by a channeling phenomenon, is suppressible. Accordingly, it is possible to prevent the boron atoms, with which the SiGe layer 33 for the gate electrode 34 has been doped, from permeating into the silicon substrate 31 even if the SiGe layer 33 is subsequently annealed, for example. As a result, any variation in device characteristics, which might result from a change in dopant concentration in the silicon substrate 31, is suppressible. Also, the SiGe layer 33 in the amorphous state has a better surface morphology than an SiGe layer 33 in a polycrystalline state. Accordingly, the SiGe layer 33 has a good surface morphology near the interface with the gate insulating film 32. Thus, the breakdown strength of the gate insulating film 32 improves. Further, the gate electrode 34 is made of the SiGe layer 33 alone. Thus, the process steps of forming the gate electrode 34 can be simplified as compared to forming a gate electrode with a multilayer structure, and the gate electrode 34 can also have its thickness reduced to e.g., 100 nm or less.

Further, according to the third embodiment, the SiGe layer 33 for the gate electrode 34 is doped with boron, so the Vt controllability of the gate electrode 34 improves.

Also, according to the third embodiment, the boron atoms in the SiGe layer 33 are activated at a higher rate than in a normal polysilicon film. Thus the boron atoms will even less likely permeate the silicon substrate 31.

Although boron ions are implanted into the SiGe layer 33 in the third embodiment, phosphorus ions may also be implanted instead (e.g., at an acceleration voltage of 10 keV and at a dose of $5\times10^{15}/cm^2$). Or boron and phosphorus ions may be both implanted at a time. Also, instead of doping the SiGe layer 33 with boron or phosphorus, for example, by an ion implantation process after the SiGe layer 33 has been deposited, the SiGe layer 33 containing boron or phosphorous, for example, may be deposited by supplying not only Si and Ge source gases but also a gas containing boron or phosphorus, for example, (e.g., $B_2H_6$ gas) during the deposition process thereof. Or the SiGe layer 33 may also be doped with boron or phosphorus, for example, by thermally diffusing $PH_3$, for example, after the SiGe layer 33 has been deposited.

Also, in the third embodiment, the process step of doping the SiGe layer 33 with boron, for example, may be omitted. Specifically, the bandgap of the SiGe layer 33 for the gate electrode 34 can be changed by controlling the Ge concentration in the SiGe layer 33. Accordingly, the Vt controllability of the gate electrode 34 can be improved without doping the SiGe layer 33 with boron, for example. As a result, even in applying this embodiment to forming a dual-gate CMOS device, there is no concern about the permeation of any dopant, e.g., boron. Further, in that case, the SiGe layer 33 does not have to be deposited in an amorphous state, nor does the SiGe layer 33 have to be kept amorphous until a dopant such as boron has been introduced.

Also, in the third embodiment, the SiGe layer 33 may have a lower Ge concentration near the lower surface thereof as compared to the other part thereof by changing the mixture ratio of Si and Ge source gases with time in the process step of depositing the SiGe layer 33. Then, it is possible to prevent the gate insulating film 32 from decreasing its breakdown strength or changing its characteristics while suppressing decrease in the Vt controllability of the gate electrode 34.

Also, in the third embodiment, an upper silicon layer may be formed on the SiGe layer 33 for the gate electrode 34 and a lower silicon layer may be formed under the SiGe layer 33 for the gate electrode 34.

MODIFIED EXAMPLE OF EMBODIMENT 3

Hereinafter, a semiconductor device and a method for fabricating the device in accordance with a modified example of the third embodiment will be described with reference to the accompanying drawings.

Unlike the third embodiment, the method of this modified example further includes the step of depositing a silicon nitride film over a gate electrode 34 after the gate electrode 34 has been formed.

FIGS. 7A through 7E are cross-sectional views corresponding to respective process steps for fabricating a semiconductor device in accordance with this modified example.

Figure 7A:
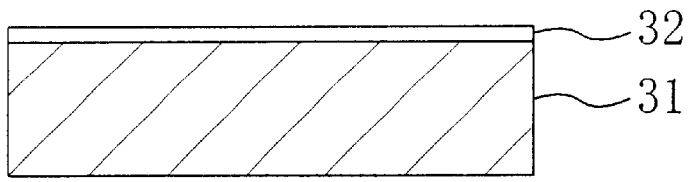
FIGS. 7A through 7E are cross-sectional views corresponding to respective process steps for fabricating a semiconductor device in accordance with a modified example of the third embodiment.

First, as shown in FIG. 7A, a gate insulating film 32 is deposited to a thickness of about 3 nm, for example, on a silicon substrate 31 of a conductivity type as in the process step shown in FIG. 6A for the third embodiment.

Figure 7B:
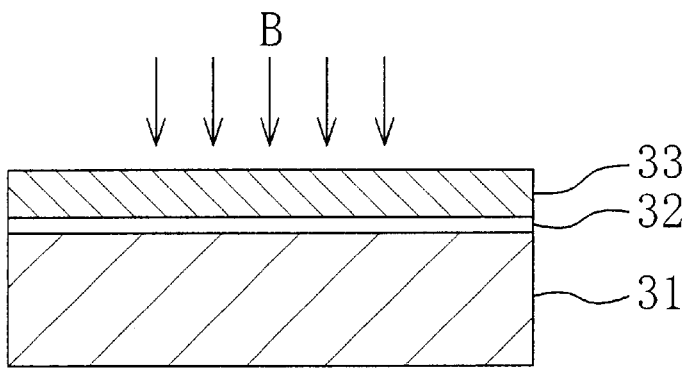

Then, as shown in FIG. 7B, an SiGe layer 33 in an amorphous state is deposited to a thickness of about 100 nm, for example, on the gate insulating film 32 by an LPCVD process with Si and Ge source gases supplied at a temperature of about 500° C. or less as in the process step shown in FIG. 6B for the third embodiment. In this process step, the Ge concentration in the SiGe layer 33 is controllable by changing the mixture ratio of the Si and Ge source gases. Specifically, in this modified example, the Ge concentration in the SiGe layer 33 is set to about 20%. Then, boron ions are implanted into the SiGe layer 33 at an acceleration voltage of 5 kev and at a dose of $1\times10^{15}/cm^2$.

Figure 7C:
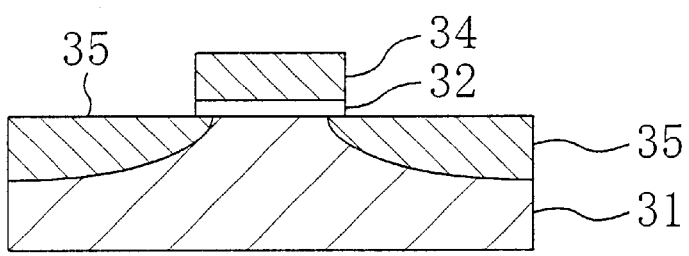

Next, as in the third embodiment, the SiGe layer 33 and the gate insulating film 32 are sequentially etched by using a mask pattern (not shown), which covers part of the substrate where a gate electrode will be formed, thereby forming a gate electrode 34 out of the SiGe layer 33 over the silicon substrate 31 with the gate insulating film 32 interposed between them as shown in FIG. 7C. Then, the silicon substrate 31 is doped with a dopant by performing an ion implantation process, for example, using the gate electrode 34 as a mask, thereby forming a doped layer 35 to be source/drain regions.

Figure 7D:
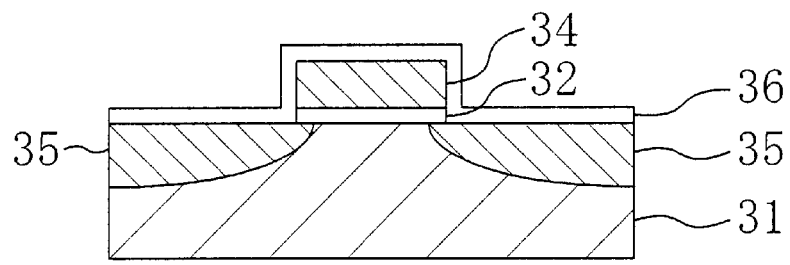
Figure 7E:
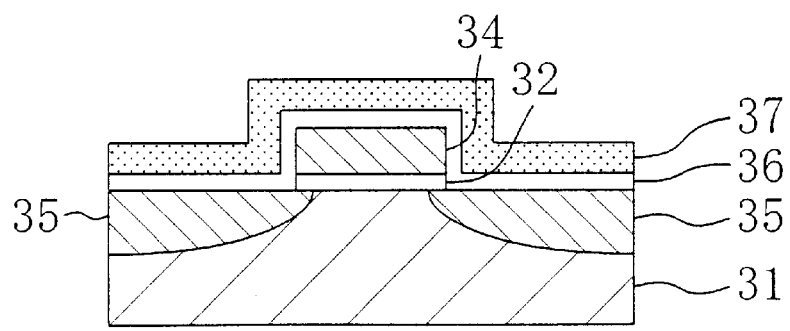

Subsequently, as shown in FIG. 7D, a silicon dioxide film 36 is deposited to a thickness of about 50 nm, for example, over the silicon substrate 31 as well as over the gate electrode 34. Then, as shown in FIG. 7E, a silicon nitride film 37 is deposited to a thickness of about 100 nm, for example, over the silicon dioxide film 36.

Next, although not shown, an interlevel dielectric film is deposited over the silicon nitride film 37. Then contacts are formed through the silicon dioxide film 36, silicon nitride film 37 and interlevel dielectric film to connect interconnects, which will be formed on the interlevel dielectric film, to the doped layer 35. In this case, the silicon nitride film 37 acts as an etch stopper in the process step of etching the interlevel dielectric film to form contact holes.

According to the modified example of the third embodiment, the following effects are attainable in addition to the effects of the third embodiment.

Normally, if a gate electrode doped with boron is formed, a silicon nitride film is deposited over the gate electrode and then the substrate is annealed (e.g., by an annealing process required to deposit an interlevel dielectric film), the boron atoms existing in the gate electrode permeate the semiconductor substrate more noticeably as compared to a situation where the annealing is carried out without depositing the silicon nitride film.

In contrast, according to this modified example, boron ions are implanted into the SiGe layer 33 in the amorphous state; the boron ions can be implanted sufficiently shallow while the penetration of the boron atoms into the silicon substrate 31, which is usually caused by a channeling phenomenon, is suppressible. Accordingly, even if the silicon nitride film 37 is deposited over the gate electrode 34 made of the SiGe layer 33, the boron atoms existing in the gate electrode 34 will not permeate the silicon substrate 31 during the subsequent annealing process.

Figure 8:
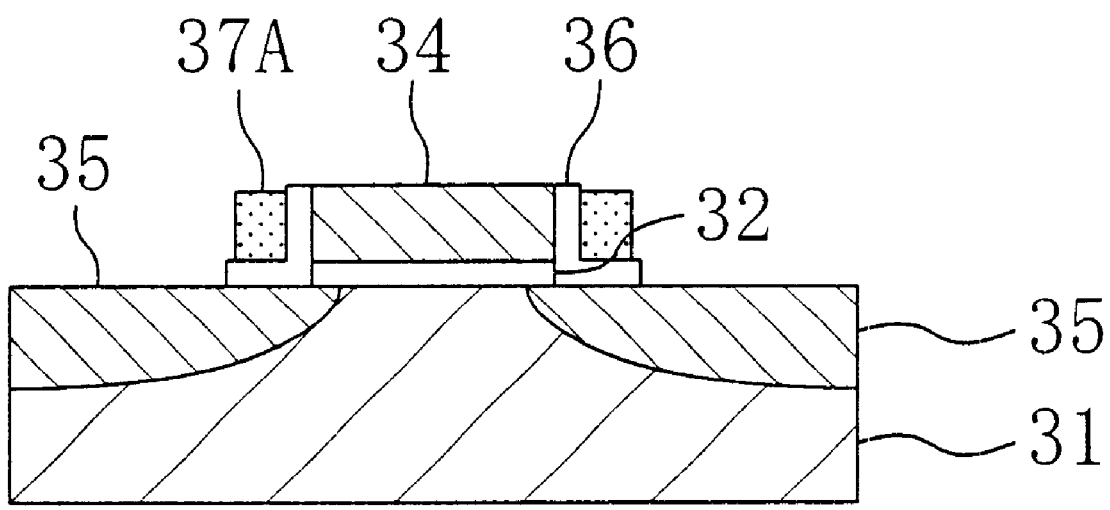
FIG. 8 is a cross-sectional view illustrating the semiconductor device in accordance with the modified example of the third embodiment.

In this modified example, the silicon nitride film 37 is used as a stopper in etching the interlevel dielectric film deposited on the silicon nitride film 37. Alternatively, a sidewall may be formed out of the silicon nitride film 37 on the side faces of the gate electrode 34. Specifically, in the process step shown in FIG. 7E, the silicon nitride film 37 is deposited over the gate electrode 34 with the silicon dioxide film 36 interposed between them. Then, as shown in FIG. 8, the silicon nitride film 37 may be etched back to form a side-wall 37A out of the silicon nitride film 37 on the side faces of the gate electrode 34 with the silicon dioxide film 36 interposed between them. Then, an MOS transistor having an LDD (lightly doped drain) structure can be formed.

Also, in this modified example, the ion implantation process step for doping the SiGe layer 33 with boron and the ion implantation process step for forming the doped layer 35 are carried out separately. Alternatively, these process steps may be carried out at a time after the gate electrode 34 has been formed.

EMBODIMENT 4

Hereinafter, a semiconductor device and a method for fabricating the device in accordance with a fourth embodiment of the present invention will be described with reference to the accompanying drawings.

FIGS. 9A through 9E are cross-sectional views corresponding to respective process steps for fabricating a semiconductor device in accordance with the fourth embodiment.

Figure 9A:
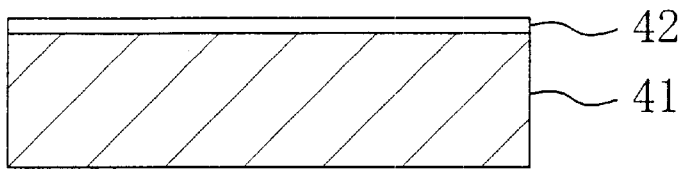
FIGS. 9A through 9E are cross-sectional views corresponding to respective process steps for fabricating a semiconductor device in accordance with a fourth embodiment of the present invention.

First, as shown in FIG. 9A, a gate insulating film 42 is deposited to a thickness of about 3 nm, for example, on a silicon substrate 41 of a conductivity type.

Figure 9B:
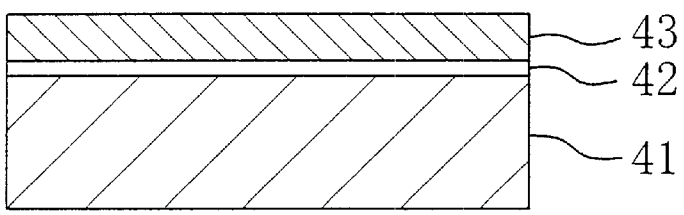

Next, as shown in FIG. 9B, an SiGe layer 43 in an amorphous state is deposited to a thickness of about 100 nm, for example, on the gate insulating film 42 by an LPCVD process with Si and Ge source gases supplied at a temperature of about 500° C. or less. In this process step, the Ge concentration in the SiGe layer 43 is controllable by changing the mixture ratio of the Si and Ge source gases. Specifically, in the fourth embodiment, the Ge concentration in the SiGe layer 43 is set to about 20%. Then, boron ions are implanted into the SiGe layer 43 at an acceleration voltage of 5 keV and at a dose of $1\times10^{15}/cm^2$.

Figure 9C:
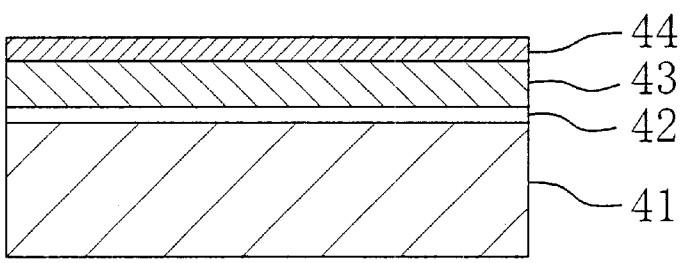
Figure 9D:
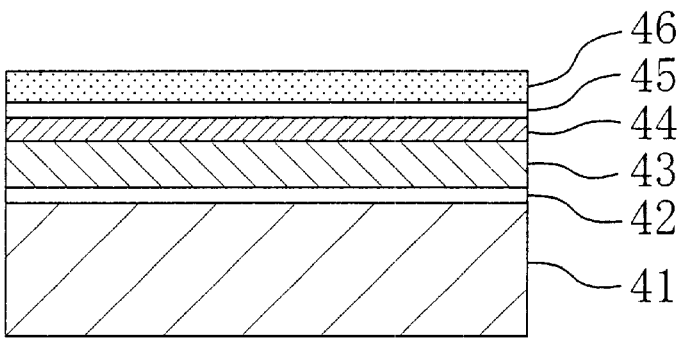

Subsequently, as shown in FIG. 9C, a metal layer 44 of tungsten, for example, is deposited to a thickness of about 50 nm, for example, on the SiGe layer 43. Then, as shown in FIG. 9D, a silicon dioxide film 45 and a silicon nitride film 46 are deposited in this order to respective thicknesses of about 50 nm and about 100 nm, for example, on the metal layer 44.

Figure 9E:
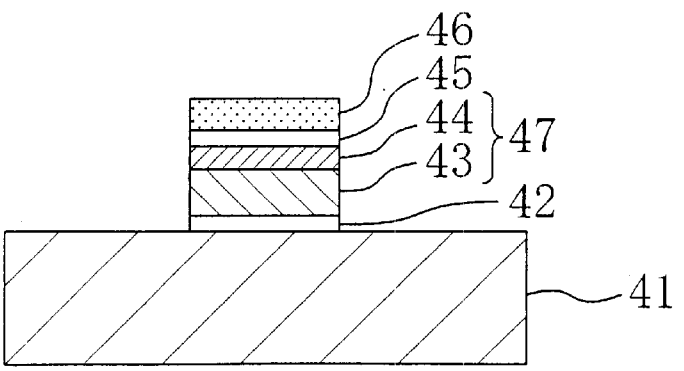

Next, the silicon nitride film 46 and the silicon dioxide film 45 are sequentially etched by using a resist pattern (not shown), which covers part of the substrate where a gate electrode will be formed. Then, the metal layer 44, SiGe layer 43 and gate insulating film 42 are sequentially etched by using the patterned silicon nitride and silicon dioxide films 46 and 45 as a hard mask, thereby forming a polymetal gate electrode 47 consisting of the SiGe and metal layers 43 and 44 over the silicon substrate 41 with the gate insulating film 42 interposed between them as shown in FIG. 9E.

In the fourth embodiment, after the SiGe layer 43 was formed and until boron ions have been implanted into the SiGe layer 43, no process steps requiring annealing are carried out to keep the SiGe layer 43 amorphous. Thus it is possible to prevent the boron atoms, existing in the SiGe layer 43, from penetrating into the silicon substrate 41 or the boron ions from being implanted too deep. After the boron ions have been implanted into the SiGe layer 43, however, the SiGe layer 43 will be polycrystalline in the end because the SiGe layer 43 will be annealed in the process step of depositing an interlevel dielectric film over the poly-metal gate electrode 47, for example.

As described above, according to the forth embodiment, an SiGe layer 43 in an amorphous state is deposited over a silicon substrate 41 with a gate insulating film 42 interposed between them. Then, after boron ions are implanted into the SiGe layer 43, a metal layer 44 is deposited on the SiGe layer 43. Thereafter, the SiGe and metal layers 43 and 44 are patterned to form a poly-metal gate electrode 47. Thus, the boron ions are implanted into the SiGe layer 43 in the amorphous state; the boron ions can be implanted sufficiently shallow while the penetration of the boron atoms into the silicon substrate 41, which is usually caused by a channeling phenomenon, is suppressible. Accordingly, it is possible to prevent the boron atoms, with which the SiGe layer 43 for the poly-metal gate electrode 47 has been doped, from permeating the silicon substrate 41 even if the SiGe layer 43 is subsequently annealed, for example. As a result, any variation in device characteristics, which might result from a change in dopant concentration in the silicon substrate 41, is suppressible. Also, the SiGe layer 43 in the amorphous state has a better surface morphology than an SiGe layer 43 in a polycrystalline state. Accordingly, the SiGe layer 43 has a good surface morphology near the interface with the gate insulating film 42. Thus, the breakdown strength of the gate insulating film 42 improves.

Further, according to the fourth embodiment, the SiGe layer 43 for the poly-metal gate electrode 47 is doped with boron, so the Vt controllability of the poly-metal gate electrode 47 improves.

Also, according to the forth embodiment, the boron atoms existing in the SiGe layer 43 are activated at a higher rate than in a normal polysilicon film. Thus the boron atoms will even less likely permeate the silicon substrate 41.

Suppose a film is deposited as a material for a gate electrode and doped with boron and then a silicon nitride film is deposited on the film and annealed (e.g., an annealing process required to deposit an interlevel dielectric film after the gate electrode has been formed). In that case, the boron atoms existing in the material film of the gate electrode normally permeate a semiconductor substrate more noticeably as compared to a situation where the annealing is carried out without depositing the silicon nitride film.

In contrast, according to the forth embodiment, boron ions are implanted into the SiGe layer 43 in an amorphous state; the boron ions can be implanted sufficiently shallow while the penetration of the boron atoms into the silicon substrate 41, which is usually caused by a channeling phenomenon, is suppressible. Accordingly, even though the silicon nitride film 46 is deposited on the poly-metal gate electrode 47 including the SiGe layer 43, the boron atoms existing in the SiGe layer 43 will not permeate the silicon substrate 41 during the subsequent annealing process.

Also, according to the forth embodiment, the silicon nitride film 46 is deposited over the poly-metal gate electrode 47 including the SiGe layer 43 with the silicon dioxide film 45 interposed between them. Thus, the boron atoms, existing in the SiGe layer 43, hardly permeate the silicon substrate 41 even if the SiGe layer 43 is annealed after that.

Although boron ions are implanted into the SiGe layer 43 in the forth embodiment, phosphorus ions may also be implanted instead (e.g., at an acceleration voltage of 10 keV and at a dose of $5 \times 10^{15}/cm^2$). Or boron and phosphorus ions may be both implanted at a time. Also, instead of doping the SiGe layer 43 with boron or phosphorus, for example, by an ion implantation process after the SiGe layer 43 has been deposited, the SiGe layer 43 containing boron or phosphorous, for example, may be deposited by supplying not only Si and Ge source gases but also a gas containing boron or phosphorus, for example, (e.g., $B_2H_6$ gas) during the deposition process thereof. Or the SiGe layer 43 may also be doped with boron or phosphorus, for example, by thermally diffusing $PH_3$, for example, after the SiGe layer 43 has been deposited.

Also, in the forth embodiment, the process step of doping the SiGe layer 43 with boron, for example, may be omitted. Specifically, the bandgap of the SiGe layer 43 for the poly-metal gate electrode 47 can be changed by controlling the Ge concentration in the SiGe layer 43. Accordingly, the Vt controllability of the poly-metal gate electrode 47 can be improved without doping the SiGe layer 43 with boron, for example. As a result, even in applying this embodiment to forming a dual-gate CMOS device, there is no concern about the permeation of any dopant, e.g., boron. Further, in that case, the SiGe layer 43 does not have to be deposited in an amorphous state, nor does the SiGe layer 43 have to be kept amorphous until a dopant such as boron has been introduced.

Also, in the forth embodiment, the SiGe layer 43 may have a lower Ge concentration near the lower surface thereof as compared to the other part thereof by changing the mixture ratio of Si and Ge source gases with time in the process step of depositing the SiGe layer 43. Then, it is possible to prevent the gate insulating film 42 from decreasing its breakdown strength or changing its characteristics while suppressing decrease in the Vt controllability of the poly-metal gate electrode 47.

Also, in the forth embodiment, an upper silicon layer may be formed between the SiGe and metal layers 43 and 44 for the poly-metal gate electrode 47 and a lower silicon layer may be formed under the SiGe layer 43 for the poly-metal gate electrode 47.

Further, in the forth embodiment, the silicon dioxide film 45 (with a thickness of about 50 nm, for example) and the silicon nitride film 46 (with a thickness of about 100 nm, for example) are deposited on the metal layer 44. Optionally, only the silicon nitride film 46 (with a thickness of about 150 nm, for example) may be deposited on the metal layer 44.

EMBODIMENT 5

Hereinafter, a semiconductor device and a method for fabricating the device in accordance with a fifth embodiment of the present invention will be described with reference to the accompanying drawings.

This embodiment relates to a method for forming a dual-gate CMOS device by one of the semiconductor device fabricating methods of the first through forth embodiments.

Figure 10A:
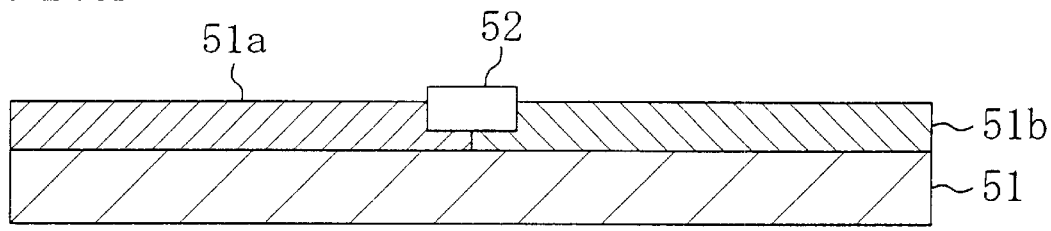
FIGS. 10A and 10B are cross-sectional views corresponding to respective process steps for fabricating a semiconductor device in accordance with a fifth embodiment of the present invention.
Figure 10B:
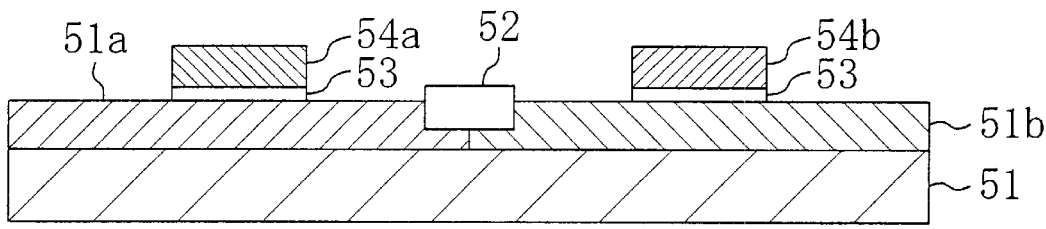
Figure 11:
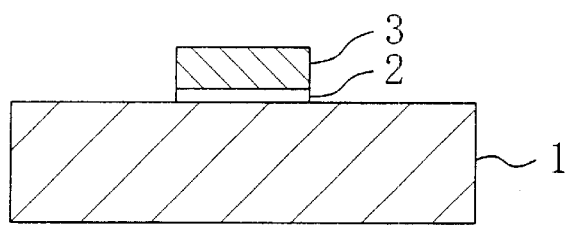
FIG. 11 is a cross-sectional view illustrating a known semiconductor device.

FIGS. 10A and 10B are cross-sectional views corresponding to respective process steps for fabricating a semiconductor device in accordance with the fifth embodiment.

First, as shown in FIG. 10A, an n-type semiconductor region 51a and a p-type semiconductor region 51b are defined in the surface of a silicon substrate 51. The n— and p— type semiconductor regions 51a and 51b are electrically isolated from each other by an isolation 52.

Then, as shown in FIG. 10B, a $p^+$ gate electrode 54a is formed over the n-type semiconductor region 51a and an $n^+$ gate electrode 54b is formed over the p-type semiconductor region 51b, in accordance with one of the methods of the first through forth embodiments. A gate insulating film 53 is interposed between the $p^+$ gate electrode 54a and the n-type semiconductor region 51a and between the $n^+$ gate electrode 54b and the p-type semiconductor region 51b. The $p^+$ gate electrode 54a includes an SiGe layer doped with a p-type dopant such as boron. The $n^+$ gate electrode 54b includes an SiGe layer doped with an n-type dopant such as phosphorous.

Subsequently, although not shown, a p-type doped layer is formed as p-type source/drain regions in the n-type semiconductor region 51a and an n-type doped layer is formed as n-type source/drain regions in the p-type semiconductor region 51b, thereby forming a dual-gate CMOS device in which p- and n-channel MOSFETs are disposed side by side.

In forming a dual-gate CMOS device, boron atoms introduced into a p+ gate electrode for a p-channel MOSFET in the dual-gate CMOS device are apt to permeate a semiconductor substrate.

In contrast, according to the fifth embodiment, the p+ gate electrode 54a for the p-channel MOSFET of the dual-gate CMOS device is formed by one of the methods of the first through fourth embodiments. Thus, a dopant such as boron, with which the p+ gate electrode 54a has been doped, hardly permeates the silicon substrate 51. Accordingly, any variation in device characteristics, which might result from a change in dopant concentration in the silicon substrate 51, is suppressible.

Likewise, according to the fifth embodiment, the n+ gate electrode 54b for the n-channel MOSFET of the dual-gate CMOS device is also formed by one of the methods of the first through fourth embodiments. Thus, a dopant such as phosphorous, with which the n+ gate electrode 54b has been doped, hardly permeates the silicon substrate 51, either. Accordingly, any variation in device characteristics, which might result from a change in dopant concentration in the silicon substrate 51, is also suppressible.

It should be noted that the process step of doping the SiGe layer of the p+ gate electrode 54a with boron, for example, may be omitted in the fifth embodiment. Specifically, the bandgap of the SiGe layer can be changed by controlling the Ge concentration in the SiGe layer. Accordingly, the Vt controllability of the p+ gate electrode 54a can be improved without doping the SiGe layer with boron, for example. Similarly, in the fifth embodiment, the process step of doping the SiGe layer of the n+ gate electrode 54b with phosphorus, for example, may also be omitted. That is to say, according to the fifth embodiment, the p+ or n+ gate electrode 54a or 54b does not have to be doped with a dopant. Thus, just by controlling the Ge concentration in the SiGe layer for the p+ or n+ gate electrode 54a or 54b, it is possible to form a dual-gate CMOS device easily while preventing the penetration or permeation of the dopant into the silicon substrate 51.

In the fifth embodiment, the p+ and n+ gate electrodes 54a and 54b are both formed by one of the methods of the first through fourth embodiments. Alternatively, either the p+ or n+ gate electrode 54a or 54b may be formed by one of the methods of the first through fourth embodiments.

What is claimed is:

1. A method for fabricating a semiconductor device comprising the steps of:
    a) depositing a gate insulating film on a semiconductor substrate;
    b) depositing a silicon germanium layer over the gate insulating film;
    c) depositing a silicon layer in an amorphous state on the silicon germanium layer; and
    d) patterning the silicon germanium layer and the silicon layer, thereby forming a gate electrode having the patterned silicon germanium layer and silicon layer.

2. The method of claim 1, further comprising the step of depositing another silicon layer on the gate insulating film between the steps a) and b),
    wherein the step d) includes patterning the another silicon layer, the silicon germanium layer and the silicon layer, thereby forming the gate electrode having the patterned another silicon layer, silicon germanium layer and silicon layer.

3. The method of claim 1, further comprising the step of e) depositing a metal layer and a silicon nitride film in this order on the silicon layer between the steps c) and d),
    wherein the step d) includes patterning the silicon nitride film and then patterning the metal layer by using the patterned silicon nitride film as a mask.

4. The method of claim 3, wherein the step e) comprises depositing an insulating layer between the metal layer and the silicon nitride film.

5. A method for fabricating a semiconductor device, comprising the steps of:
    a) depositing a gate insulating film on a semiconductor substrate;
    b) depositing a silicon germanium layer in an amorphous state over the gate insulating film; and
    c) patterning the amorphous silicon germanium layer, thereby forming a gate electrode having the patterned silicon germanium layer,
    wherein the gate electrode is used as a gate electrode for at least one of two MOS transistors in a dual-gate MOS device.

6. The method of claim 5, further comprising the step of:
    d) depositing a metal layer and silicon nitride film in this order on the amorphous silicon germanium layer between the steps b) and c),
    wherein the step c) includes patterning the silicon nitride film and then patterning the metal layer by using the patterned silicon nitride film as a mask.

7. The method of claim 6, wherein the step d) comprises depositing an insulating layer between the metal layer and the silicon nitride film.

8. The method of claim 1 or 5, wherein the step b) includes: supplying a first source gas containing silicon and a second source gas containing germanium; and changing a mixture ratio of the first and second source gases with time, thereby setting a germanium concentration in a part of the silicon germanium layer near a lower surface thereof lower than a germanium concentration in the other part of the silicon germanium layer.

9. The method of claim 1 or 5, further comprising the step of implanting boron or phosphorus ions into the silicon germanium layer.

10. The method of claim 1 or 5, wherein the step b) includes supplying a gas containing silicon, a gas containing germanium and a gas containing boron or phosphorus, thereby depositing the silicon germanium layer containing boron or phosphorus.

11. The method of claim 1 or 5, further comprising the step of depositing a silicon nitride film over the gate electrode with an insulating layer interposed between the gate electrode and the silicon nitride film.

12. A method for fabricating a semiconductor device comprising the steps of:
    a) depositing a gate insulating film on a semiconductor substrate;
    b) depositing a silicon germanium layer over the gate insulating film;
    c) depositing a silicon layer in an amorphous state on the silicon germanium layer; and
    d) patterning the silicon germanium layer and the silicon layer, thereby forming a gate electrode having the patterned silicon germanium layer and silicon layer, wherein the silicon germanium layer contains boron or phosphorus.

13. A method for fabricating a semiconductor device comprising the steps of:
   a) depositing a gate insulating film on a semiconductor substrate;
   b) depositing a silicon germanium layer over the gate insulating film;
   c) depositing a silicon layer in an amorphous state on the silicon germanium layer; and
   d) patterning the silicon germanium layer and the silicon layer, thereby forming a gate electrode having the patterned silicon germanium layer and silicon layer, wherein the gate electrode is used as a gate electrode for at least one of two MOS transistors in a dual-gate MOS device.

14. A method for fabricating a semiconductor device, comprising the steps of:
   a) depositing a gate insulating film on a semiconductor substrate;
   b) depositing a silicon germanium layer in an amorphous state over the gate insulating film; and
   c) patterning the amorphous silicon germanium layer, thereby forming a gate electrode having the patterned silicon germanium layer, wherein the amorphous silicon germanium layer contains boron or phosphorus.

* * * * *

UNITED STATES PATENT AND TRADEMARK OFFICE
CERTIFICATE OF CORRECTION

PATENT NO.     : 6,589,827 B2
DATED          : July 8, 2003
INVENTOR(S)    : Hiroko Kubo et al.

It is certified that error appears in the above-identified patent and that said Letters Patent is hereby corrected as shown below:

<u>Title page,</u>
Item [75], change "Hiroko Kubo, Uji (JP)" to -- Hiroko Kubo, Kyoto (JP) --

Signed and Sealed this

Sixth Day of April, 2004

JON W. DUDAS
*Acting Director of the United States Patent and Trademark Office*